(12) United States Patent
Siebens

(10) Patent No.: US 9,124,050 B2
(45) Date of Patent: Sep. 1, 2015

(54) ELECTRICAL CONNECTOR HAVING GROUNDING MECHANISM

(71) Applicant: Thomas & Betts International, Inc., Wilmington, DE (US)

(72) Inventor: Larry N. Siebens, Asbury, NJ (US)

(73) Assignee: THOMAS & BETTS INTERNATIONAL LLC, Wilmington, DE (US)

( * ) Notice: Subject to any disclaimer, the term of this patent is extended or adjusted under 35 U.S.C. 154(b) by 110 days.

(21) Appl. No.: 13/943,920

(22) Filed: Jul. 17, 2013

(65) Prior Publication Data

US 2014/0024241 A1     Jan. 23, 2014

Related U.S. Application Data

(60) Provisional application No. 61/673,469, filed on Jul. 19, 2012.

(51) Int. Cl.

| | |
|---|---|
| *H01R 13/53* | (2006.01) |
| *H01R 24/66* | (2011.01) |
| *H01R 11/15* | (2006.01) |
| *H01R 13/207* | (2006.01) |
| *H01R 4/56* | (2006.01) |
| *H01R 13/447* | (2006.01) |
| *H01R 13/648* | (2006.01) |
| *H01R 24/20* | (2011.01) |

(Continued)

(52) U.S. Cl.
CPC ............... *H01R 24/66* (2013.01); *H01R 11/15* (2013.01); *H01R 13/207* (2013.01); *H01R 13/53* (2013.01); *H01R 4/56* (2013.01); *H01R 13/447* (2013.01); *H01R 13/648* (2013.01); *H01R 24/20* (2013.01); *H01R 2101/00* (2013.01); *H02B 13/0358* (2013.01); *H02B 13/075* (2013.01)

(58) Field of Classification Search
CPC ............... H01R 13/53; H01R 13/6485; H01R 13/6666; H01R 13/703; H01R 23/6873; H01R 13/7036
USPC .......................................... 439/181, 187, 921
See application file for complete search history.

(56) References Cited

U.S. PATENT DOCUMENTS

| | | | |
|---|---|---|---|
| 2,941,834 A | 6/1960 | Appleton et al. | |
| 3,740,700 A | 6/1973 | Robertson | |

(Continued)

FOREIGN PATENT DOCUMENTS

EP     0 147 979     7/1985

*Primary Examiner* — Xuong Chung Trans
(74) *Attorney, Agent, or Firm* — Snyder, Clark, Lesch and Chung, LLP

(57) ABSTRACT

An elbow-type power cable electrical connector includes a connector body having a bushing receiving end projecting substantially perpendicularly from the connector body and a connection end projecting substantially perpendicularly from the connector body and oriented substantially opposite to the bushing receiving end, wherein the bushing receiving end is configured to receive a switchgear bushing therein. A grounding device is configured for insertion into the connection end of the connector, wherein the grounding device is configured to conductively connect to the switchgear bushing. The grounding devices include an exposed conductive portion configured to engage a grounded hot line clamp, during grounding of the electrical connector assembly. An insulated cap is provided to cover the exposed conductive portion of the grounding device during normal operation of the electrical connector.

17 Claims, 13 Drawing Sheets

(51) Int. Cl.
    *H01R 101/00* (2006.01)
    *H02B 13/035* (2006.01)
    *H02B 13/075* (2006.01)

(56) References Cited

U.S. PATENT DOCUMENTS

| | | | |
|---|---|---|---|
| 3,883,208 A | 5/1975 | Sankey et al. | |
| 4,202,591 A | 5/1980 | Borgstrom | |
| 4,471,160 A | 9/1984 | Arthur | |
| 4,744,765 A | 5/1988 | DeLeo | |
| 4,787,855 A | 11/1988 | Finke | |
| 4,799,895 A | 1/1989 | Borgstrom | |
| 4,822,289 A | 4/1989 | DeLeo | |
| 4,859,192 A | 8/1989 | DeLeo | |
| 4,865,559 A | 9/1989 | Clabburn | |
| 5,114,357 A | 5/1992 | Luzzi | |
| 5,131,855 A | 7/1992 | Pickering | |
| 6,075,209 A | 6/2000 | Luzzi | |
| 6,332,785 B1 | 12/2001 | Muench, Jr. et al. | |
| 7,381,103 B2 | 6/2008 | Luzzi | |
| 7,503,785 B2 | 3/2009 | Stepniak | |
| 8,128,423 B2 * | 3/2012 | Borgstrom et al. | 439/181 |
| 2008/0227342 A1 | 9/2008 | Luzzi | |
| 2009/0124130 A1 | 5/2009 | Hughes et al. | |
| 2012/0021650 A1 | 1/2012 | Borgstrom et al. | |

* cited by examiner

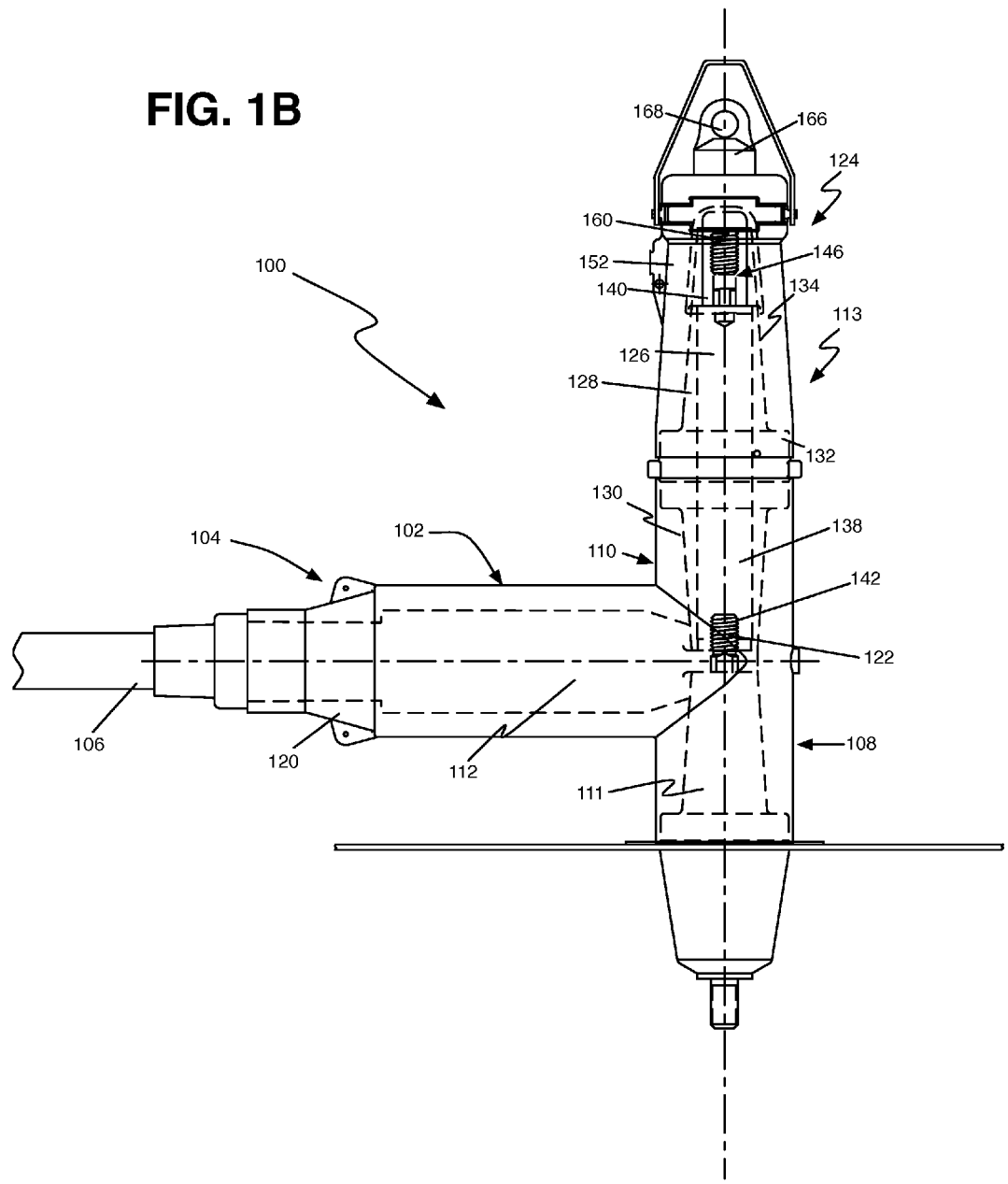

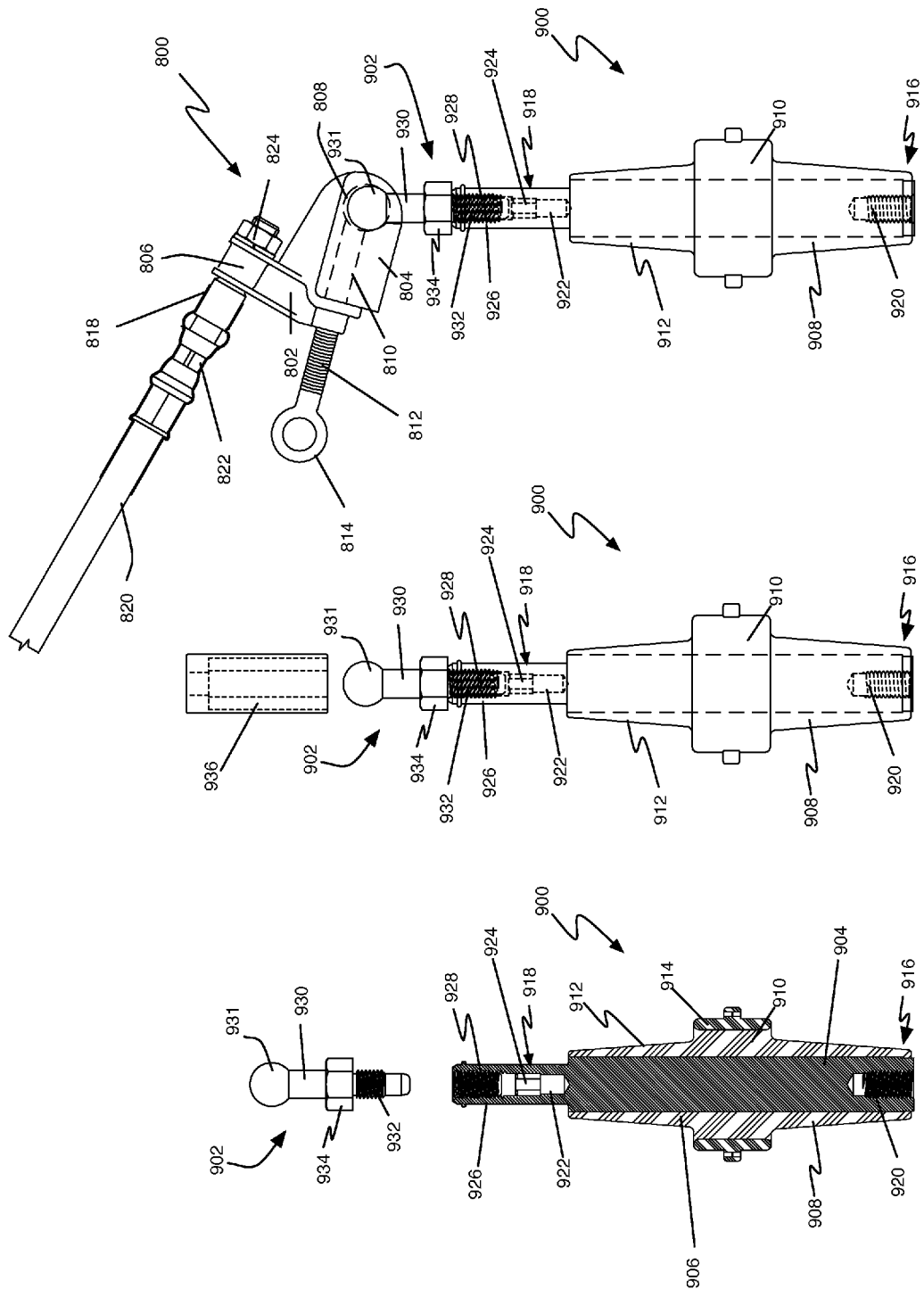

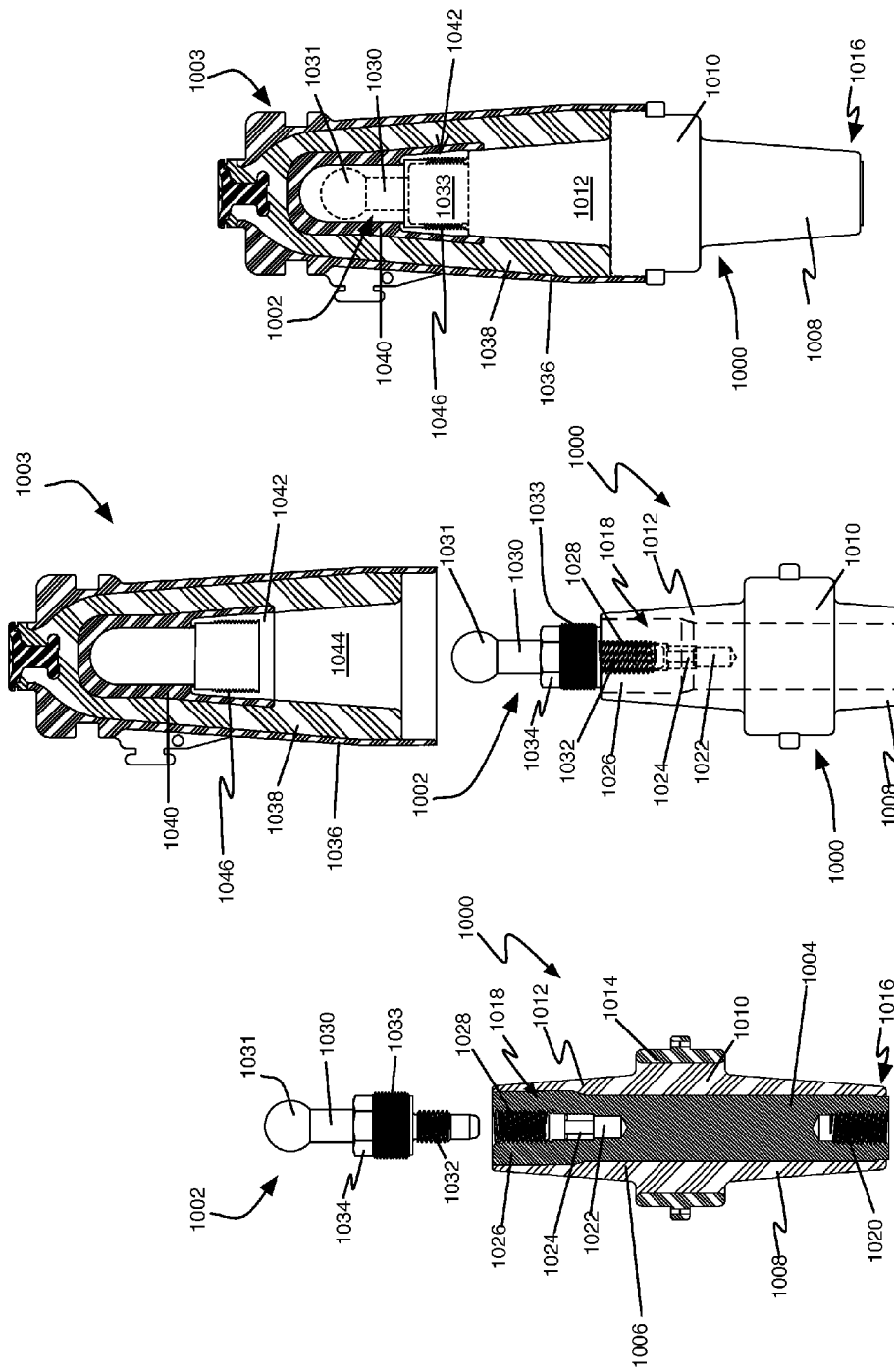

ELECTRICAL CONNECTOR HAVING GROUNDING MECHANISM

CROSS-REFERENCE TO RELATED APPLICATION

This application claims priority under 35 U.S.C. §119, based on U.S. Provisional Patent Application No. 61/673,469, filed Jul. 19, 2012, the disclosure of which is hereby incorporated by reference herein

BACKGROUND OF THE INVENTION

The present invention relates to electrical cable connectors, such as loadbreak connectors and deadbreak connectors. More particularly, aspects described herein relate to an electrical cable connector, such as a power cable elbow or T-connector connected to electrical switchgear assembly.

Loadbreak connectors used in conjunction with 15 and 25 KV switchgear generally include a power cable elbow connector having one end adapted for receiving a power cable and another end adapted for receiving a loadbreak bushing insert or other switchgear device. The end adapted for receiving the bushing insert generally includes an elbow cuff for providing an interference fit with a molded flange on the bushing insert.

In some implementations, the elbow connector may include a second opening formed opposite to the bushing insert opening for facilitating connection of the elbow connector to the bushing and to provide conductive access to the power cable by other devices, such as a surge arrestor, a tap plug, etc.

BRIEF DESCRIPTION OF THE DRAWINGS

FIG. 1B is a schematic side view of the power cable elbow connector of FIG. 1A in an assembled configuration.

FIGS. 9A-9C are side view illustrations of another exemplary grounding device consistent with embodiments described herein; and FIGS. 10A-10C are combined side/cross-sectional views of still another exemplary grounding device and insulated cap consistent with embodiments described herein.

DETAILED DESCRIPTION OF THE PREFERRED EMBODIMENTS

The following detailed description refers to the accompanying drawings. The same reference numbers in different drawings may identify the same or similar elements.

Figure 1A:
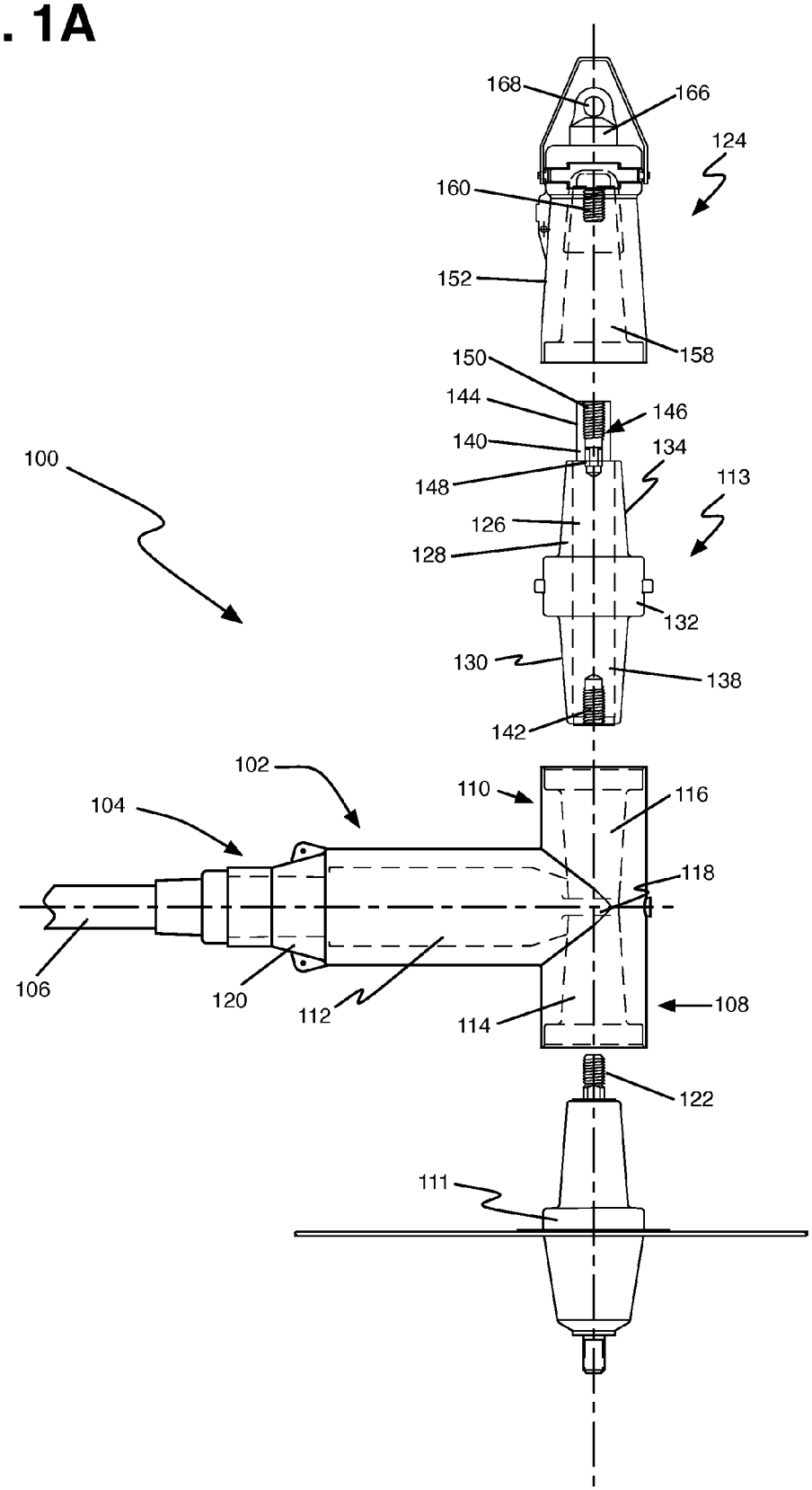
FIG. 1A is a schematic, exploded side view illustrating a power cable electrical connector consistent with implementations described herein.

FIG. 1A is a schematic exploded side view of a power cable elbow connector 100 consistent with implementations described herein. FIG. 1B is a schematic side view of the power cable elbow connector 100 in an assembled configuration. As shown, power cable elbow connector 100 may include a main housing body 102 that includes a conductor receiving end 104 for receiving a power cable 106 therein and first and second T-ends 108/110 that include openings for receiving an equipment bushing, such as a deadbreak or loadbreak transformer bushing 111 or other high or medium voltage terminal, such as an insulating plug, or other power equipment. Consistent with implementations described herein, second T-end 110 may be configured to receive a grounding device 113 described in additional detail below.

As shown, conductor receiving end 104 may extend along a main axis of connector 100 and may include a bore 112 extending therethrough. First and second T-ends 108/110 may project substantially perpendicularly from conductor receiving end 104 in opposing directions from one another. First and second T-ends 108/110 may include bores 114/116, respectively, formed therethrough for receiving equipment, bushings, and/or plugs. A contact area 118 may be formed at the confluence of bores 112, 114, and 116.

Power cable elbow connector 100 may include an electrically conductive outer shield 120 formed from, for example, a conductive peroxide-cured synthetic rubber, commonly referred to as EPDM (ethylene-propylene-dienemonomer). Within shield 120, power cable elbow connector 100 may include an insulative inner housing, typically molded from an insulative rubber or epoxy material, and a conductive or semi-conductive insert that surrounds the connection portion of power cable 106.

As shown in FIG. 1A, bushing 111 may include a stud portion 122 projecting axially therefrom. During assembly of elbow connector 100 onto bushing 111, as shown in FIG. 1B, stud portion 122 of bushing 111 is received into contact area 118 and extend through an opening in a spade portion coupled to power cable 106 (not shown).

Figure 2:
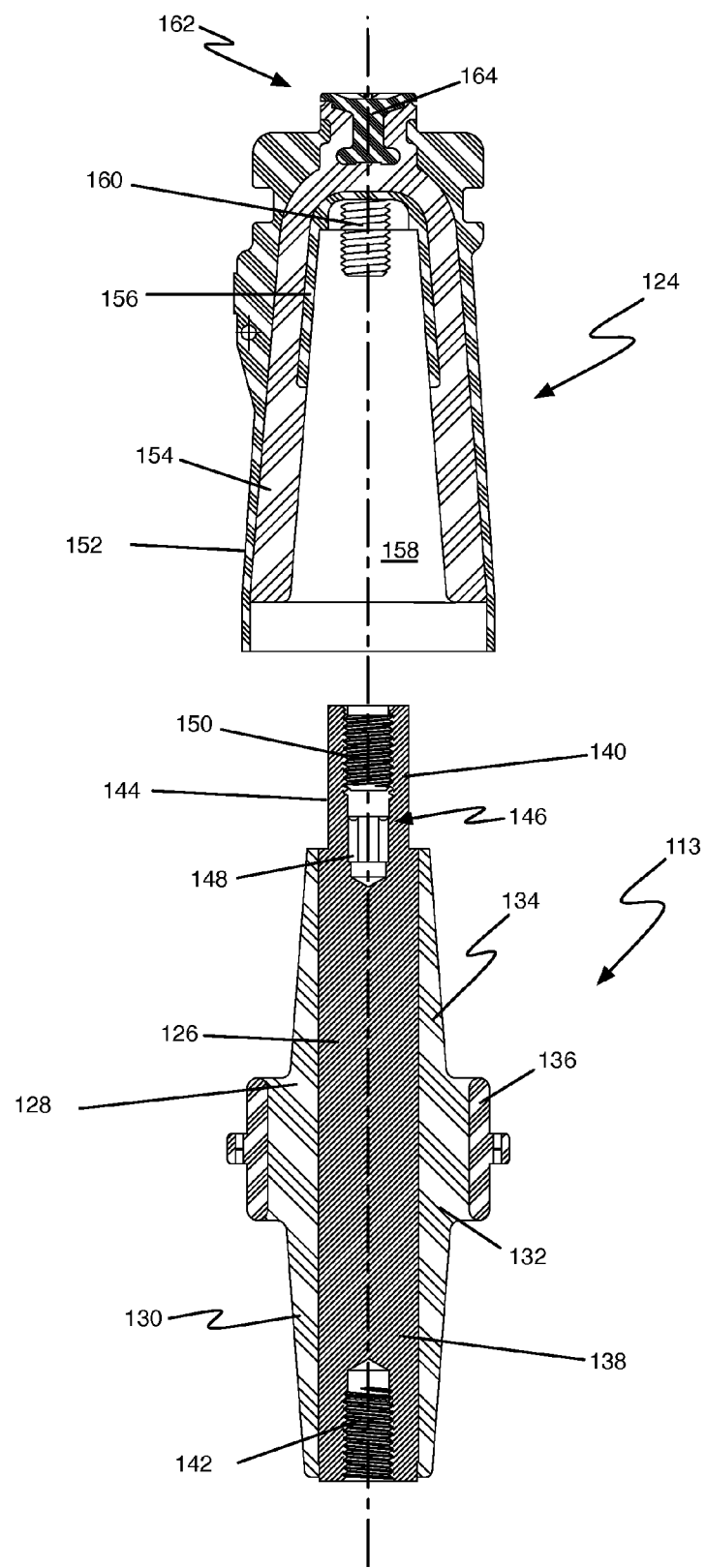
FIG. 2 is a cross-sectional view of the grounding device and insulated cap of FIG. 1.

Consistent with embodiments described herein, grounding device 113 may be configured to conductively couple to power cable 106 and bushing 111. In an initial configuration, an insulated cap 124 may be installed onto grounding device 113. FIG. 2 is a detailed cross-sectional view of grounding device 113 and insulated cap 124.

As shown in FIG. 2, grounding device 113 includes a conductive core portion 126 and an insulated body 128. In one implementation, insulated body 128 may include a first tapered portion 130, a central portion 132, and a second tapered portion 134. As shown, first portion 130 includes a tapered configuration for seating within bore 116 in second T-end 110 of main housing body 102.

Central portion 132 includes a generally cylindrical configuration having a larger diameter than an interior end of first tapered portion 130. During assembly, as shown in FIG. 1B, central portion 132 abuts an outer surface of second T-end 110.

Second tapered portion 134 projects from central portion 132 in an axial direction away from first tapered portion 132 and includes a tapered configuration for receiving a cavity 158 in insulated cap 124 (described below). Consistent with embodiments described herein, insulated body 128 may be formed of an insulative rubber or epoxy material. Furthermore, as shown in FIG. 2, central portion 132 may include an outer shield portion 136 formed on a radial periphery thereof. Outer shield portion 136 may be formed of a conductive or semi-conductive material, such as EPDM. As shown in FIG. 1B, following assembly, outer shield portion 136 of grounding device 113 remains exposed. By providing outer shield portion 136 of a conductive material (similar to main housing body 102), electrical continuity is maintained throughout an exterior of the assembled connector 100.

As shown in FIG. 2, conductive core 126 includes a substantially cylindrical configuration that extends through an interior of insulated body 128. Conductive core 126 includes a stud receiving end 138 and a clamp engaging end 140 that projects beyond an end of insulated body 128. Conductive core 126 may be formed of a conductive material, such as brass, steel, or aluminum and, upon assembly, may conductively couple with power cable 106 and bushing 112 via stud portion 122.

In one embodiment, stud receiving end 138 may include a threaded opening 142 for matingly engaging corresponding threads on stud portion 122 of bushing 111, although other means for coupling with stud portion 122 may be incorporated, such as a push or snap-on connection, etc. Furthermore, in some implementations, the male/female relationship of stud portion 122 and stud receiving end 138 may be reversed.

As shown in FIG. 2, clamp engaging end 140 includes a clamp engaging outer surface 144 and a multi-function bore 146 formed axially therein. As shown, clamp engaging outer surface 144 extends beyond an end of second tapered end 134 of insulated body 128. As described in detail below, clamp engaging outer surface 144 provides an engagement surface for engaging a hot line clamp or other suitable ground clamp device. Although clamp engaging outer surface 144 is depicted in FIG. 2 as having a smooth configuration, in other implementations, clamp engaging outer surface 144 may be provided with a high friction surface, such as a grooved or knurled surface to facilitate secure clamping.

Multi-function bore 146 extends axially within clamp engaging end 140 of conductive core 126 and includes a grounding device attachment portion 148 and cap securing portion 150. As shown in FIG. 2, grounding device attachment portion 148 of multi-function bore 146 may be formed on the interior of multi-function bore 146 and includes a tool engaging configuration for receiving a tool, such as a hex wrench, therein.

During assembly of elbow connector 100, first tapered portion 130 and stud receiving end 138 of grounding device 113 are inserted into bore 116 in second T-end 110. Threaded opening 142 in conductive core 126 may be threaded onto stud portion 122 of bushing 111. A suitable tool is then inserted into multi-function bore 146 and into engagement with grounding device attachment portion 148. The tool is then rotated to secure grounding device 113 within second T-end 110. Although grounding device attachment portion 148 is depicted in FIG. 2 as including a hexagonal surface configuration, in other embodiments, different types of tool engaging configurations may be used, such as flat or Phillips head configurations, a Torx configuration, a 12-sided configuration, etc.

As shown in FIG. 2, cap securing portion 150 of multi-function bore 146 may include an internally threaded configuration for use in securely retaining insulated cap 124. Insulated cap 124 may include an outer conductive or semi-conductive shield 152, an insulative inner housing 154, typically molded from an insulative rubber or epoxy material, and a conductive or semi-conductive insert 156 that surrounds clamp engaging end 140 of conductive core 126 once insulated cap 124 is installed on grounding device 113.

As shown in FIG. 2, insulated cap 124 includes a substantially conical cavity 158 formed therein for receiving clamp engaging end 140 and second tapered portion 134 of grounding device 113. As described briefly above, the conical configuration of cavity 158 corresponds to the tapered configuration of second tapered portion 134 to allow insulated cap 124 to become seated on grounding device 113 during installation. Furthermore, as shown in FIG. 2, insulated cap 124 may include an engagement stud 160 having a threaded outer surface for engaging threaded cap securing portion 150 of multi-function bore 146 in conductive core 126. During assembly, engagement stud 160 may be threaded into cap securing portion 150 and tightened to secure insulated cap 124 to grounding device 113.

In one exemplary implementation, insulated cap 124 may include a voltage detection test point assembly 162 for sensing a voltage in connector 100. Voltage detection test point assembly 162 may be configured to allow an external voltage detection device to detect and/or measure a voltage associated with elbow connector 100.

For example, as illustrated in FIG. 2, voltage detection test point assembly 162 may include a test point terminal 164 embedded in a portion of insulative inner housing 154 of insulated cap 124 and extending through an opening within outer shield 152. In one exemplary embodiment, test point terminal 164 may be formed of a conductive metal or other conductive material. In this manner, test point terminal 164 may be capacitively coupled to conductive core 126 of grounding device 113 upon installation of insulated cap to grounding device 113.

As shown in FIGS. 1A and 1B, a test point cap 166 may sealingly engage an exposed portion of test point terminal 164 and outer shield 152. In one implementation, test point cap 166 may be formed of a semi-conductive material, such as EPDM. When test point terminal 164 is not being accessed, test point cap 166 may be mounted on test point assembly 162. Because test point cap 166 is formed of a conductive or semiconductive material, test point cap 166 may ground test point assembly 162 when in position. Test point cap 166 may include an aperture 168 for facilitating removal, e.g., using a hooked lineman's tool. In addition, insulated cap 124 may include a bailing assembly for use in securing cap 124 and grounding device 113 to elbow connector 100.

Figure 3:
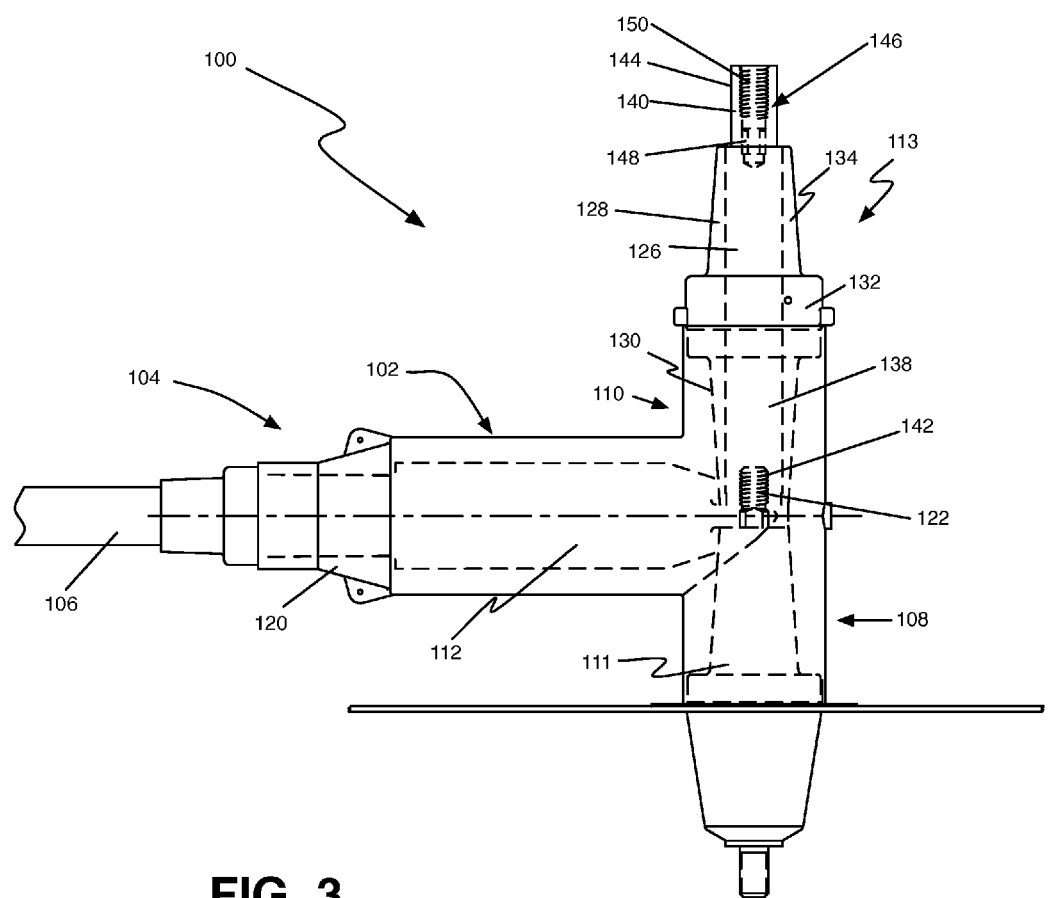
FIG. 3 is a schematic side view of the electrical connector of FIG. 1 in a partially disassembled configuration.

When it is desired to perform work on a particular line or switchgear component, it is necessary to ensure that the system is properly de-energized and grounded before work can begin. Consistent with embodiments described herein, to accomplish this, a technician first tests connector 100, e.g., using voltage detection test point assembly 162, to ensure that connector 100 has been de-energized. If the test indicates that the connector 100 is de-energized, insulated cap 124 is removed (e.g., by unscrewing) from grounding device 113. FIG. 3 is a schematic side view of connector 100 in a partially disassembled configuration, e.g., after removal of insulated cap 124 from grounding device 113. As shown in FIG. 3, in this configuration, clamp engaging end 140 of conductive core 126 is exposed.

Figure 4:
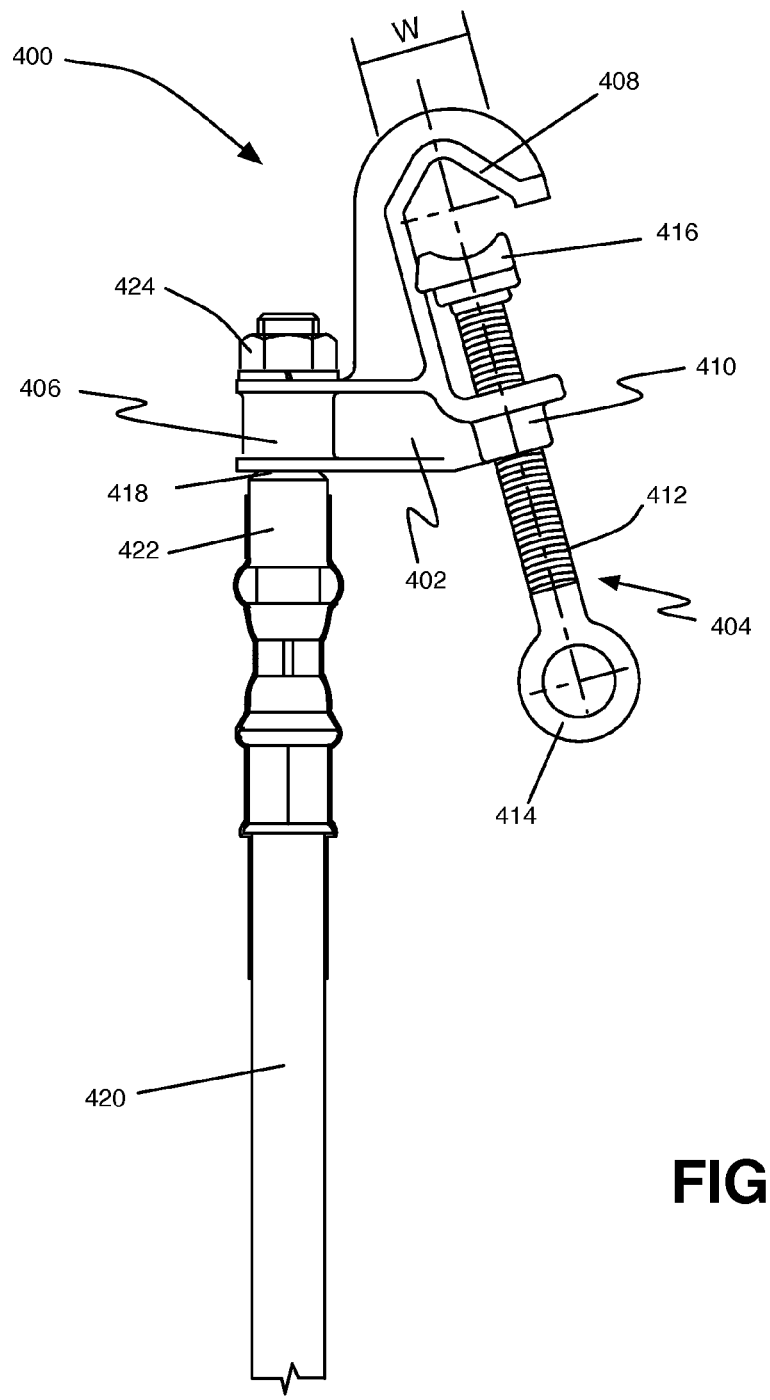
FIG. 4 is a schematic side view of an exemplary hot line clamp.
Figure 5:
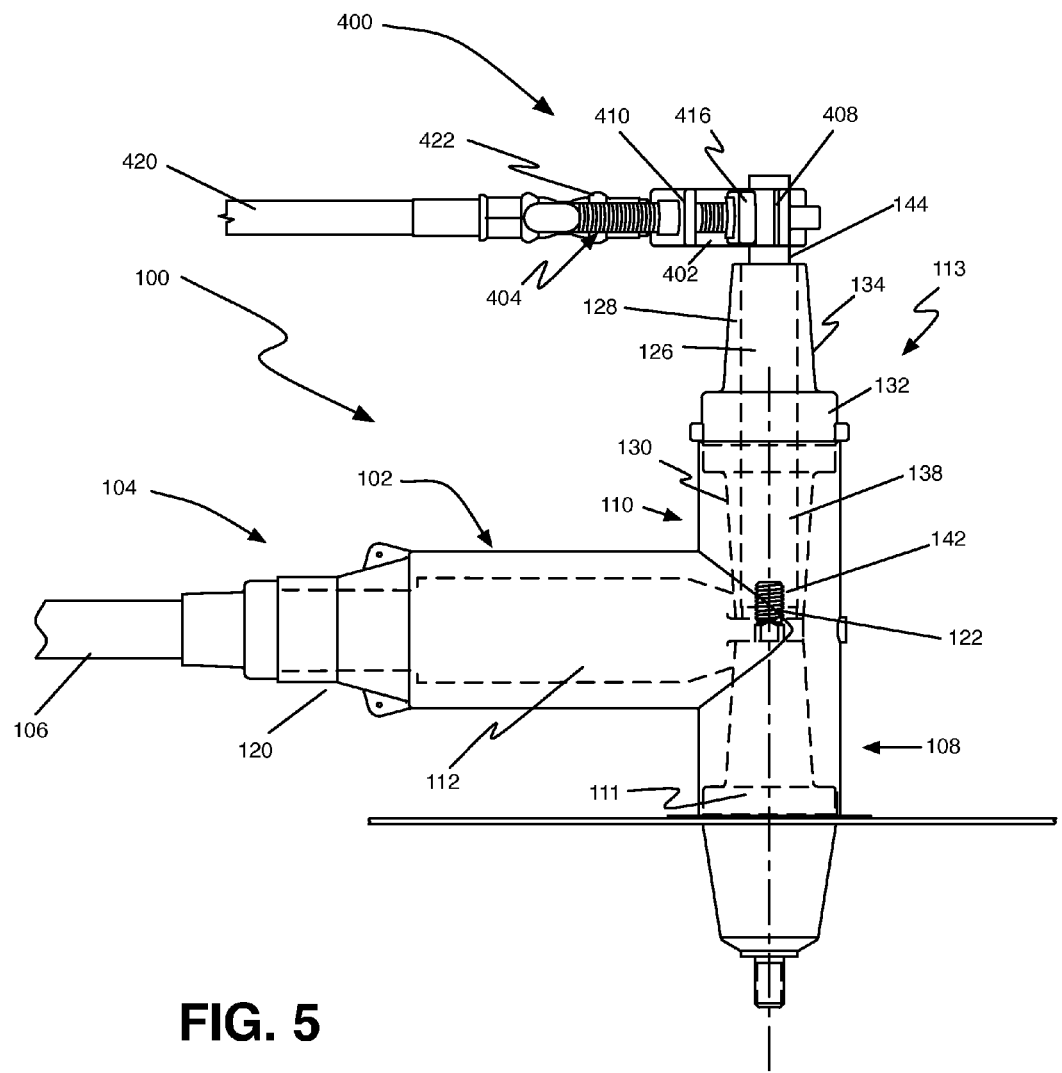
FIG. 5 is a schematic side view of the hot line clamp of FIG. 4 coupled to the elbow connector of FIG. 3 in a manner consistent with embodiments described herein.

FIG. 4 is a schematic side view of an exemplary hot line clamp 400. FIG. 5 is a schematic side view of hot line clamp 400 coupled to elbow connector 100 in a manner consistent with embodiments described herein.

Referring to FIG. 4, in one exemplary implementation, hot line clamp 400 includes a conductive body 402, a clamping member 404, and a ground line attachment portion 406. Conductive body 402 may be formed of a conductive metal, such as brass or aluminum and may include a generally v or c-shaped region 408 for receiving a portion of clamp engaging end 140 of conductive core 126. For example, a width "W" may be substantially similar, yet slightly larger than an outside diameter of clamp engaging end 140. With such a configuration, v-shaped region 408 may easily slip onto exposed clamp engaging end 140 following removal of insulated cap 124.

As shown in FIG. 4, conductive body 402 may include an opposing portion 410 projecting from body 402 in a location opposing v-shaped region 408. Opposing portion 410 includes a threaded aperture therethrough configured to receive clamping member 404, such that clamping member is positioned in clamping relation to v-shaped region 408.

Clamping member 404, in one exemplary embodiment, includes a generally cylindrical, threaded body 412 having a tool engaging portion 414 on one end and a part engagement portion 416 on an opposing end, distal from tool engaging portion 414. During assembly of hot line clamp 400, body 412 is threaded through opposing portion 410 such that part engagement portion 416 opposes v-shaped region 408.

As shown in FIG. 5, during connection of hot line clamp 400 to elbow connector 100, v-shaped region 408 of conductive body 402 is placed over the exposed clamp engaging end 140 of ground device 113. Tool engaging portion 414 of clamping member 404 is then rotated, e.g., using a lineman's hook, causing part engagement portion 416 to travel toward v-shaped region 408, thus securing clamp engaging end 140 of grounding device 113 within hot line clamp 400.

Returning to FIG. 4, conductive body 402 of hot line clamp 400 also includes an aperture 418 for receiving ground line attachment portion 406. Ground line attachment portion 406 may include a mechanism for securing a ground line 420 to, for example, a threaded lug 422. In one implementation, ground line attachment portion 406 may include a crimp style connector for securing ground line 420 to lug 422. As shown in FIG. 4, lug 422 may be inserted into aperture 418 in conductive body 402 and secured using nut 424.

Embodiments described herein increase the efficiency with which work may be performed on a power line or switchgear component by providing an efficient means for grounding elbow connector 100 without requiring disassembly of the connector or replacement of the connector with a single-purpose grounding component. Rather, grounding device 113 is maintained within elbow connector 100 for use when needed. When grounding is not needed, insulated cap 124 may be reinstalled and power cable elbow connector 100 may operate in a conventional manner.

Figure 6:
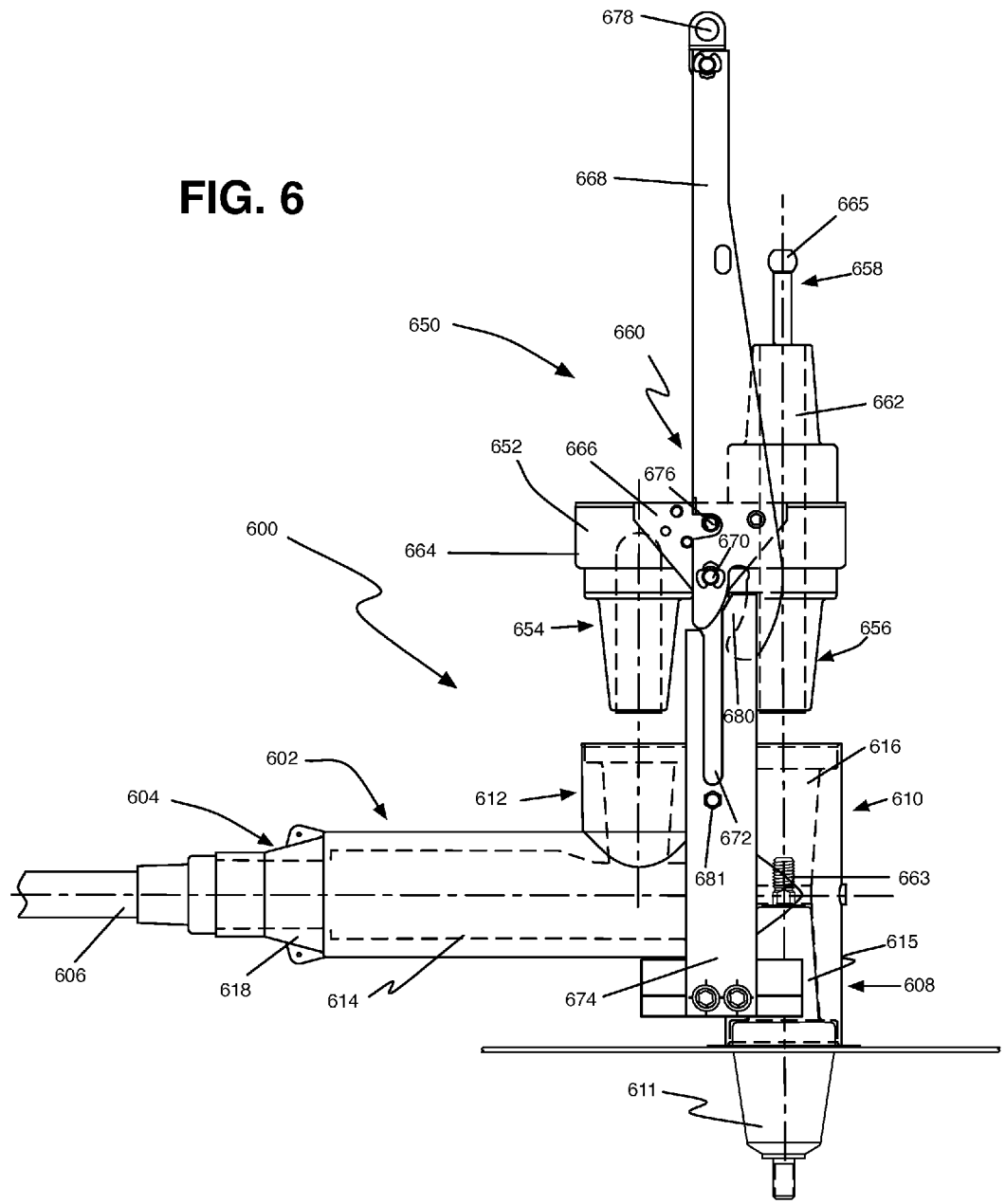
FIG. 6 is a schematic, partially exploded, side view diagram of another embodiment of a power cable elbow connector consistent with embodiments described herein.
Figures 7A, 7B:
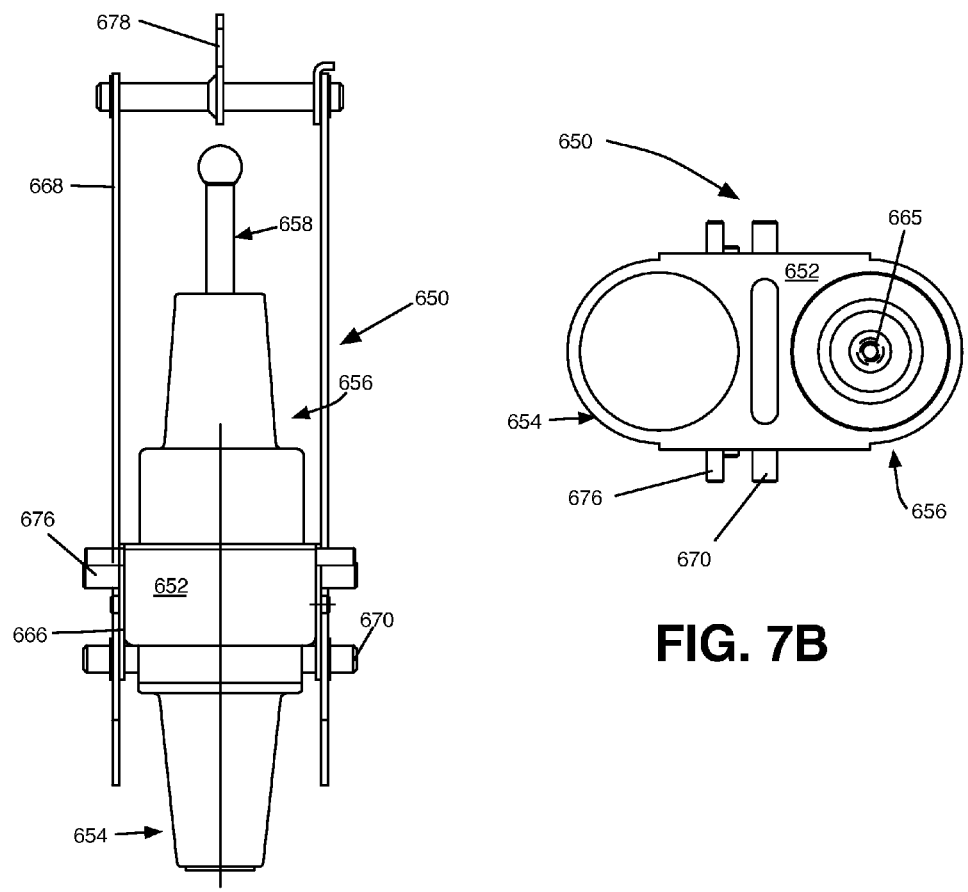
FIGS. 7A and 7B are end and top views, respectively, of the grounding cam-op link assembly of FIG. 6.
Figure 8A:
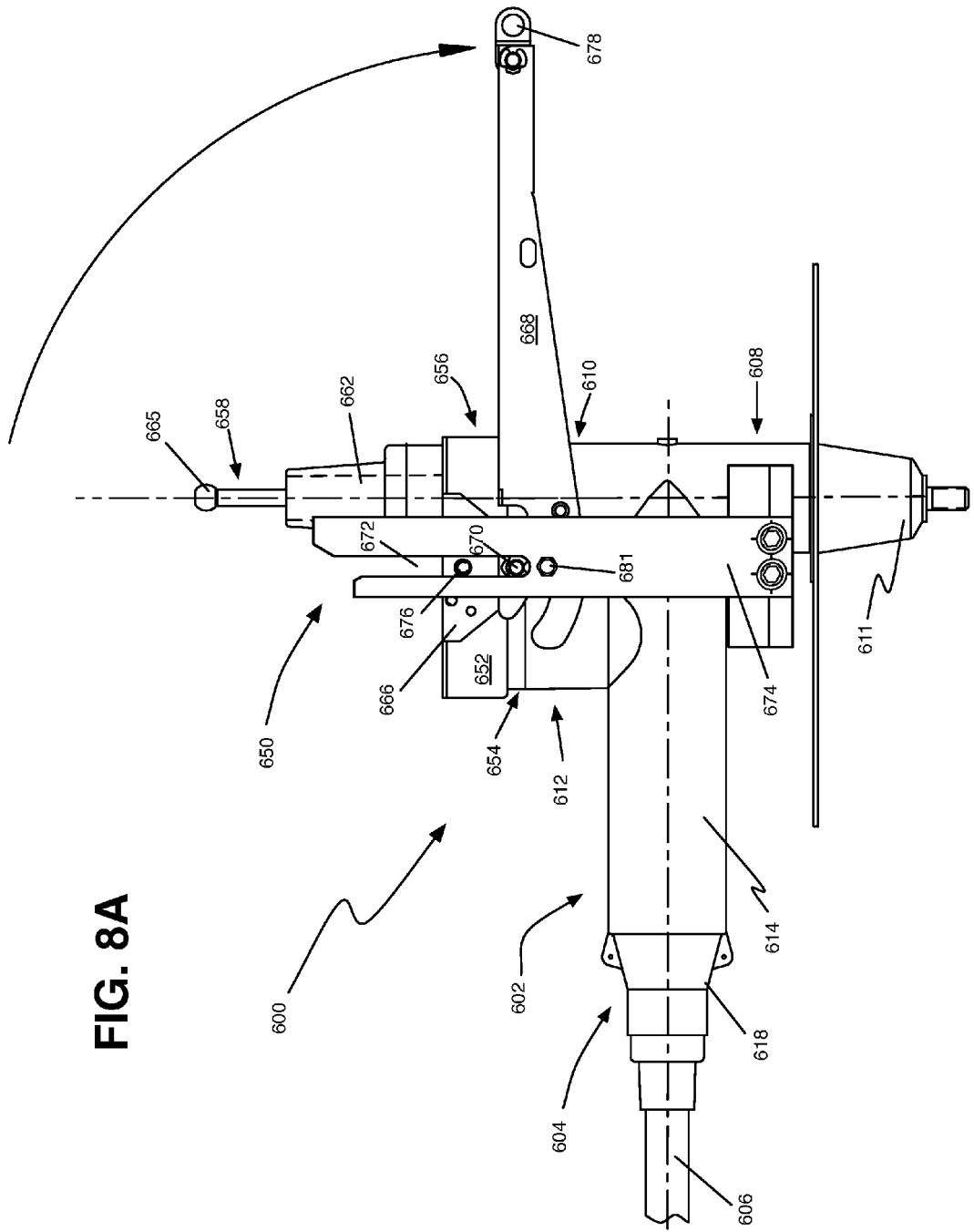
FIGS. 8A-8C are side view illustrations of the power cable elbow connector of FIG. 1 during installation and use of the grounding cam-op link assembly.
Figure 8B:
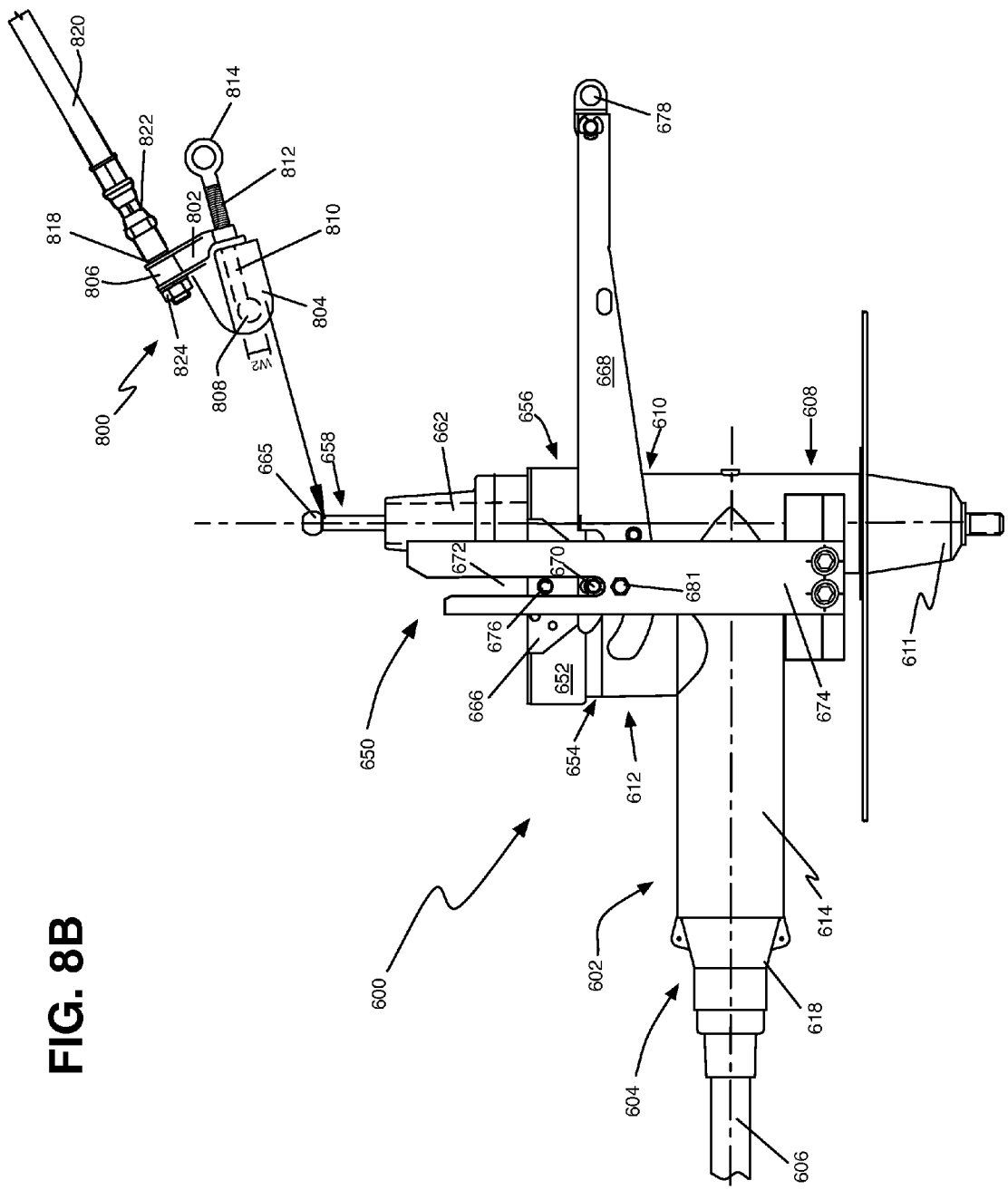
Figure 8C:
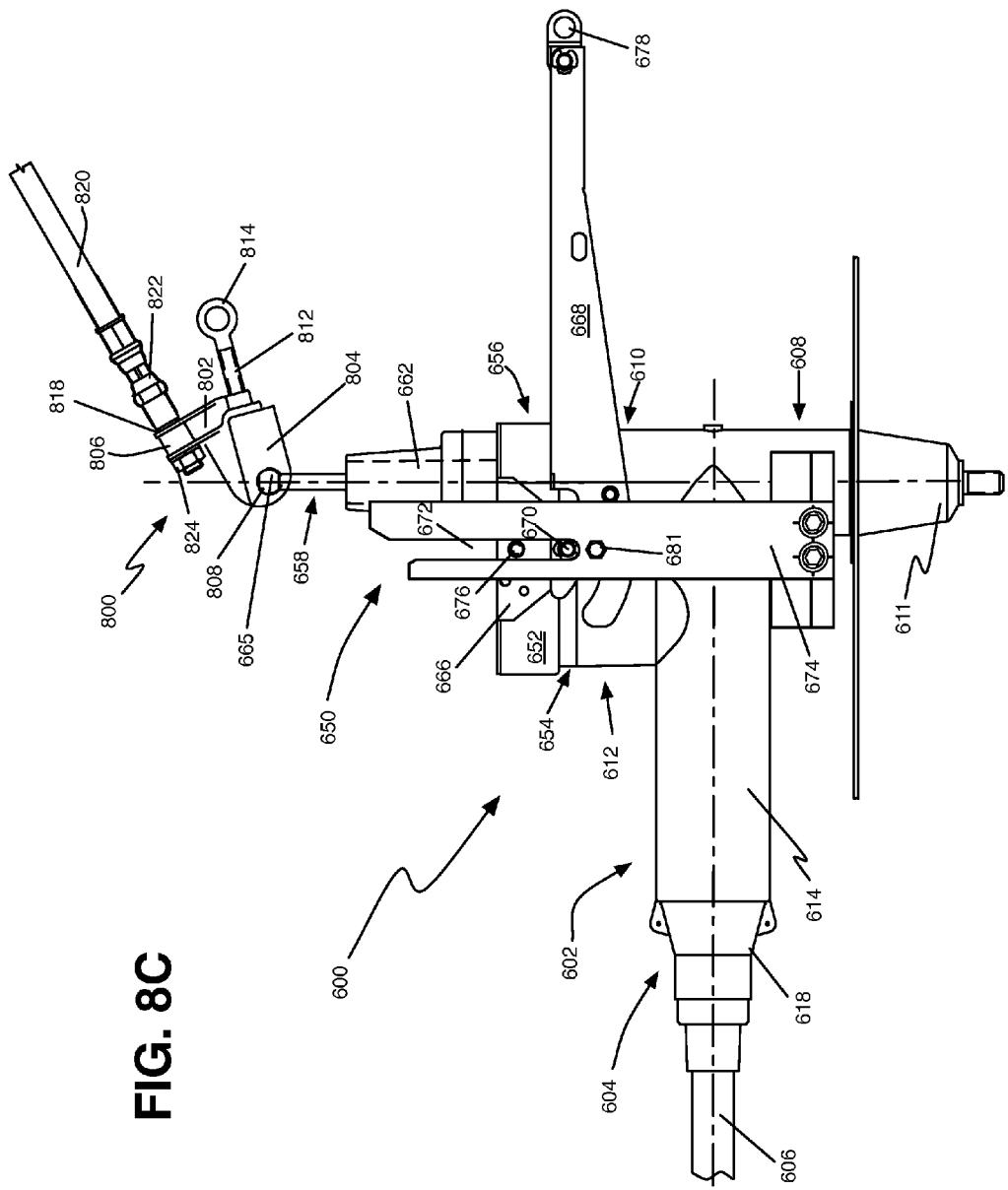

FIG. 6 is a schematic, partially exploded, side view diagram of another power cable elbow connector 600 consistent with embodiments described herein. FIGS. 7A and 7B are end and top views, respectively, of a grounding cam-op link assembly 650. FIGS. 8A-8C are side view illustrations of power cable elbow connector 600 during installation and use of grounding cam-op link assembly 650.

As shown in FIG. 6, power cable elbow connector 600 includes a body portion 602, a conductor receiving end 604 for receiving a power cable 606 therein (also referred to as the "line"), first and second T-ends 608/610 distal from conductor receiving end 604 that include openings for receiving a deadbreak transformer bushing 611, or other high or medium voltage terminals (also referred to as the "load"), such as an insulating plug, or other power equipment (e.g., a tap, a voltage arrestor, etc.). Power cable elbow connector 600 further includes a link interface 612, which, in combination with second T-end 610 receives a cam-op link therein. Although not shown in FIG. 6, power cable elbow connector 600 includes equipment for terminating power cable 606 in a manner that is electrically isolated from first and second T-ends 608/610. A cam-op link (not shown) is used to bridge the conductive gap between power cable 606 and bushing 611.

As shown, conductor receiving end 604 may extend along a main axis of connector 600 and may include a bore 614 extending therethrough. First and second T-ends 608/610 may project substantially perpendicularly from conductor receiving end 604 in opposing directions from one another. Link interface 612 may also project perpendicularly from conductor receiving end 604 in a direction parallel to second T-end 610. First and second T-ends 608/610 may include bores 615/616, respectively, formed therethrough for receiving bushing 611, and one of the legs of a cam-op link (not show), respectively. As briefly described above, link interface 612 may receive the other leg of the cam-op link during assembly. Moreover, link interface 612 may include a conductive stud (not shown) that is electrically coupled to power cable 606. A leg of cam-op link inserted into link interface 612 includes a stud receiving portion for receiving the conductive stud, to facilitate electrical contact from bushing 611 to power cable 606 via the cam-op link.

Similar to power cable elbow connector 100 described above, power cable elbow connector 600 may include an electrically conductive outer shield 618 formed from, for example, a conductive or semi-conductive peroxide-cured synthetic rubber, such as EPDM. Further, although not shown in the Figures, power cable elbow connector 600 may further include an insulative inner housing, typically molded from an insulative rubber or silicon material, and a conductive or semi-conductive insert that surrounds the connection portion of power cable 106. As briefly described above, the area between first and second T-ends 608/610 and link interface 612 may be filled with an insulative material, so as to electrically isolate first and second T-ends 608/610 from link interface 612.

Consistent with embodiments described herein, when it becomes necessary to ground the "load" side of connector 600 (e.g., bushing 611), the cam-op link may be removed and a grounding cam-op link assembly 650 may be installed within second T-end 610 and link interface 612.

As shown in FIG. 6, grounding cam-op link assembly 650 includes link body portion 652, rearward link interface bushing 654, forward link interface bushing 656, grounding interface 658, and link engagement assembly 660. Grounding cam-op link 650 may be configured to provide a grounded interface for terminal bushing 611, which is electrically isolated from power cable 606.

As shown in FIG. 6, link body portion 652 extends substantially axially with rearward and forward link interface bushings 654/656 projecting substantially perpendicularly therefrom. Although not shown in the Figures, rearward link interface bushing 654 includes a stud receiving bus for receiving the conductive stud couple to power cable 606. Upon installation into connector 600, rearward link interface bushing 654 may be configured to align with (and sized for insertion into) link interface 612 and forward link interface bushing 656 may be configured to align with (and sized for insertion into) second T-end 610, as shown in FIGS. 8A and 8B.

Forward link interface bushing 656 may include a conductive core 662 extending therethrough. Similar to conductive core 126 of grounding device 113 described above, conductive core 662 is configured to interface with stud 663 in bushing 611, such as via correspondingly threaded engagement. Grounding interface 658 extends from conductive core 662 and projects above a surface of link body portion 652.

As shown in FIG. 6, in one implementation, grounding interface 658 includes a ball end 665, designed to engage with a suitably sized ball socket clamp (element 800 in FIGS. 8B and 8C), as described in detail below. Conductive core 662 and grounding interface 658 may be formed as one element of conductive material, such as copper, brass, steel, or aluminum. In other implementations, grounding interface 658 may be separate from a secured to conductive core 662.

Grounding cam-op link assembly 650 may include an electrically conductive outer shield 664 formed from, for example, EPDM. Within shield 664, grounding cam-op link assembly 650 may include an insulative inner housing. In some embodiments, a portion of outer shield 664 and inner housing between the rearward and forward link interface bushings 654/656 may be provided with a viewing port extending therethrough for visually ensuring the absence of a conductive link between link interface 612 and bushing 611.

As shown in FIG. 6, link engagement assembly 660 may include a link arm bracket 666 and a link arm 668. Link arm bracket 666 may be secured to grounding cam-op link 600 (e.g., via one or more bolts, etc.). Link arm 668 may, in turn, be rotatably secured to link arm bracket 666 via a pivot pin 670. In some implementations, pivot pin 670 may extend from link arm 668 to engage a corresponding slot 672 in a cam-op link bracket 674 connected to elbow connector 600. Link arm bracket 666 may include a stop 676 for preventing link arm 668 from rotating past a vertical orientation and a hole 678 in an end of link arm 668 distal from pivot pin 670, for enabling engagement of link arm 668 by a suitable tool, such as a hotstick or lineman's tool. Downward movement of the tool may cause link arm 668 to rotate downward about pivot pin 670 toward rearward link interface bushing 654 and forward link interface bushing 656.

Link arm 668 may also include a curved clamp pin engagement slot 680 for engaging a corresponding clamp pin in cam-op link bracket 674. Rotation of link arm 668 about pivot pin 670 when grounding cam-op link assembly 650 is installed in connector 100 (as shown in FIG. 8A) may cause clamp pin engagement slot 680 to slidingly engage clamp pin 681, thereby securing grounding cam-op link assembly 650 to connector 600.

Once installed within link interface 612 and second T-end 610, as shown in FIGS. 8B and 8C, ball socket clamp 800 may be installed on grounding interface 658. In one exemplary implementation, ball socket clamp 800 includes a conductive body 802, a clamping member 804, and a ground line attachment portion 806. Conductive body 802 may be formed of a conductive metal, such as brass or aluminum and may include a socket portion 808 formed therein for receiving ball end 665 of grounding interface 658. For example, a width "W2" may be substantially similar, yet slightly larger than an outside diameter of ball end 665. With such a configuration, socket portion 808 may easily slip onto exposed ball end 665 following installation of grounding cam-op link 650 into elbow connector 600.

As shown in FIG. 8B, conductive body 802 may include a threaded aperture 810 for receiving clamping member 804, such that clamping member 804 is positioned in clamping relation to socket portion 808. Clamping member 804, in one exemplary embodiment, includes a generally cylindrical, threaded body 812 having a tool engaging portion 814 on one end and a ball engaging portion (not shown) on an opposing end, distal from tool engaging portion 814. During assembly of ball socket clamp 800, body 812 is threaded through aperture 810 such that the ball engaging portion engages ball end 665 of grounding interface 658.

As shown in FIG. 8C, during connection of ball socket clamp 800 to grounding interface 658, socket portion 808 of conductive body 802 is placed over exposed ball end 665 of grounding interface 658. Tool engaging portion 814 of clamping member 804 is then rotated, e.g., using a lineman's hook, causing the ball engaging portion to travel toward socket portion 808, thus securing ball end 665 of grounding interface 658 within ball socket clamp 800.

As shown in FIGS. 8B and 8C, conductive body 802 of ball socket clamp 800 also includes an aperture 818 for receiving ground line attachment portion 806. Ground line attachment portion 806 may include a mechanism for securing a ground line 820 to, for example, a threaded lug 822. In one implementation, ground line attachment portion 806 may include a crimp style connector for securing ground line 820 to lug 822. Lug 822 may be inserted into aperture 818 in conductive body 802 and secured using nut 824.

Embodiments described herein increase the efficiency with which work may be performed on a power line or switchgear component by providing an efficient means for grounding elbow connector 600. More specifically, a conventional cam-op link assembly may be easily removed and replaced with grounding cam-op link assembly 650. The grounding interface 658 of grounding cam-op link assembly may then be coupled to a grounded ball socket clamp 800 to facilitate grounding of connector 600.

FIGS. 9A-9C are side view illustrations of another exemplary grounding device consistent with embodiments described herein. In particular, FIG. 9A is a cross-sectional diagram illustrating an exemplary grounding device 900 and grounding interface 902 in a pre-assembled configuration. FIG. 9B is a side view of grounding device 900 and grounding interface 902 in an assembled configuration. FIG. 9C is a side view of grounding device 900 and grounding interface 902 showing ball socket clamp 800 installed on grounding interface 902.

Consistent with embodiments described herein, grounding device 900, similar to grounding device 113 described above, includes a conductive core portion 904 and an insulated body 906. In one implementation, insulated body 906 includes a first tapered portion 908, a central portion 910, and a second tapered portion 912.

Central portion 910 includes a generally cylindrical configuration having a larger diameter than an interior end of first tapered portion 906. During assembly, central portion 910 abuts an outer surface of second T-end 110 in power cable elbow connector 100.

Second tapered portion 912 projects from central portion 910 in an axial direction away from first tapered portion 908 and includes a tapered configuration for receiving an insulated cap, similar to insulated cap 124 described above in relation to FIGS. 1 and 2.

Insulated body 906 may be formed of an insulative rubber or epoxy material. Furthermore, in some embodiments, central portion 910 includes an outer shield portion 914 formed on a radial periphery thereof. Outer shield portion 914 may be formed of a conductive or semi-conductive material, such as EPDM.

Conductive core 904 includes a substantially cylindrical configuration that extends through an interior of insulated body 906. Conductive core 904 includes a stud receiving end 916 and a grounding interface receiving end 918 that projects beyond an end of insulated body 906. Conductive core 904 may be formed of a conductive material, such as brass, steel, or aluminum and, upon assembly, may conductively couple with power cable 106 and bushing 112 in power cable elbow connector 100.

In one embodiment, stud receiving end 916 includes a threaded opening 920 for matingly engaging corresponding threads on a bushing, such as bushing 111 described above.

However, in other embodiments, other means for coupling with the bushing may be incorporated, such as a push or snap-on connection, etc.

As shown in FIG. 9A, grounding interface receiving end 918 includes a substantially cylindrical outer surface 144 and a multi-function bore 922 formed axially therein. As shown, grounding interface receiving end 918 extends beyond an end of second tapered end 912 of insulated body 906. As described in detail below, grounding interface receiving end 918 is configured to receive and secure grounding interface 902 to grounding device 900.

Multi-function bore 922 extends axially within grounding interface receiving end 918 and includes a grounding device attachment portion 924 and grounding interface/insulated cap securing portion 926. Grounding device attachment portion 924 of multi-function bore 922 may be formed on the interior of multi-function bore 922 and includes a tool engaging configuration for receiving a tool, such as a hex wrench, therein.

During assembly of grounding device 900 to elbow connector 100, first tapered portion 908 of grounding device 900 is inserted into bore 116 in second T-end 110 of connector 100. Threaded opening 920 in stud receiving end 916 in conductive core 904 may be threaded onto stud portion 122 of bushing 111. A suitable tool is then inserted into multi-function bore 922 and into engagement with grounding device attachment portion 924. The tool is then rotated to secure grounding device 900 within second T-end 110.

As shown in FIG. 9A, grounding interface/insulated cap securing portion 926 of multi-function bore 922 may include an internally threaded portion 928 for use in securely retaining both grounding interface 902 and an insulated cap, such as insulated 124, described above.

As shown, grounding interface 902 includes a conductive body 930 having a ball end 931, designed to engage with a suitably sized ball socket clamp, such as ball socket clamp 800 described above. As shown in FIG. 9A, conductive body 930 of grounding interface 902 may include a threaded portion 932 configured to engage grounding interface/insulated cap securing portion 926 of multi-function bore 922. Grounding interface 902 may also include a tool engaging portion 934 configured to enable grounding interface 902 to be secured to grounding device 900 using a wrench or hexagonal socket.

In some embodiments, conductive core 930, ball end 931, and tool engaging portion 934 may be formed as one element of conductive material, such as copper, brass, steel, or aluminum. In other implementations, one or more of these components may be formed separately and secured to conductive core 930, such as via welding, etc.

During assembly, as shown in FIG. 9B, threaded portion 932 of conductive body of grounding interface 902 may be inserted into multi-function bore 922. Threaded portion 932 then engages threaded portion 928 in multi-function bore 922. A socket, such as socket 936 shown in FIG. 9B may be used to apply torque to tool engaging portion 934 to secure grounding interface 902 to grounding device 900.

As shown in FIG. 9C, during connection of ball socket clamp 800 to grounding interface 902, socket portion 808 is placed over exposed ball end 931 of grounding interface 902. Tool engaging portion 814 of clamping member 804 is then rotated, e.g., using a lineman's hook, causing the ball engaging portion to travel toward socket portion 808, thus securing ball end 931 of grounding interface 902 within ball socket clamp 800.

When it is no longer necessary to ground connector 100, grounding interface 902 may be removed (e.g., using socket 936) and a suitable insulating cap may be installed over second tapered portion 912 and secured via multi-function bore 922 in a manner similar to that described above in relation to FIGS. 1A, 1B, and 2.

Although the embodiment of FIGS. 9A-9C is shown with respect to a reducing plug for inserting into a T-end of a power cable elbow connector, in other embodiments, the configuration of grounding interface 902 may be applied to other devices, such as cam-op link devices, similar to those described above in relation to FIGS. 6-8C.

FIGS. 10A-10C are cross sectional/side view illustrations of yet another exemplary grounding device consistent with embodiments described herein. In particular, FIG. 10A is a cross-sectional diagram illustrating an exemplary grounding device 100 and grounding interface 1002 in a pre-assembled configuration. FIG. 10B is a side view of grounding device 1000 and grounding interface 1002 in an assembled configuration and further illustrating (in cross-section) an exemplary insulating cap 1003 positioned for assembly on grounding device 1000. FIG. 10C is a side view of grounding device 1000 and grounding interface 1002 showing insulating cap 1003 installed on grounding interface 1000.

Consistent with embodiments described herein, grounding device 1000, similar to grounding device 900 described above in relation to FIGS. 9A-9C, includes a conductive core portion 1004 and an insulated body 1006. In one implementation, insulated body 1006 includes a first tapered portion 1008, a central portion 1010, and a second tapered portion 1012.

Central portion 1010 includes a generally cylindrical configuration having a larger diameter than an interior end of first tapered portion 1006. During assembly, central portion 910 abuts an outer surface of second T-end 110 in power cable elbow connector 100.

Second tapered portion 1012 projects from central portion 1010 in an axial direction away from first tapered portion 1008 and includes a tapered configuration for receiving insulated cap 1003, as described in additional detail below.

Insulated body 1006 may be formed of an insulative rubber or epoxy material. Furthermore, in some embodiments, central portion 1010 includes an outer shield portion 1014 formed on a radial periphery thereof. Outer shield portion 1014 may be formed of a conductive or semi-conductive material, such as EPDM.

Conductive core 1004 includes a substantially cylindrical configuration that extends through an interior of insulated body 1006. Conductive core 1004 includes a stud receiving end 1016 and a grounding interface receiving end 1018. Conductive core 1004 may be formed of a conductive material, such as brass, steel, or aluminum and, upon assembly, may conductively couple with power cable 106 and bushing 112 in power cable elbow connector 100 following installation.

In one embodiment, stud receiving end 1016 includes a threaded opening 1020 for matingly engaging corresponding threads on a bushing, such as bushing 111 described above. However, in other embodiments, other means for coupling with the bushing may be incorporated, such as a push or snap-on connection, etc.

As shown in FIG. 10A, grounding interface receiving end 1018 includes a multi-function bore 1022 formed axially therein. Multi-function bore 1022 extends axially within grounding interface receiving end 1018 and includes a grounding device attachment portion 1024 and grounding interface securing portion 1026. Grounding device attachment portion 1024 of multi-function bore 1022 may be formed on the interior of multi-function bore 1022 and includes a tool engaging configuration for receiving a tool, such as a hex wrench, therein.

During assembly of grounding device 1000 to elbow connector 100, first tapered portion 1008 of grounding device 1000 is inserted into bore 116 in second T-end 110 of connector 100. Threaded opening 1020 in stud receiving end 1016 in conductive core 1004 may be threaded onto stud portion 122 of bushing 111. A suitable tool is then inserted into multi-function bore 1022 and into engagement with grounding device attachment portion 1024. The tool is then rotated to secure grounding device 1000 within second T-end 110.

As shown in FIG. 10A, grounding interface securing portion 1026 of multi-function bore 1022 may include an internally threaded portion 1028 for use in securely retaining grounding interface 1002, as described below.

Consistent with embodiments described herein, grounding interface 1002 includes a conductive body 1030 having a ball end 1031, designed to engage with a suitably sized ball socket clamp, such as ball socket clamp 800 described above. As shown in FIG. 10A, conductive body 1030 of grounding interface 1002 includes first a threaded portion 1032 configured to engage grounding interface securing portion 1026 of multi-function bore 1022. Grounding interface 1002 may also include a second threaded portion 1033 configured to engage an interior portion of cap 1003, as described below, and a tool engaging portion 1034 configured to enable grounding interface 1002 to be secured to grounding device 1000 using a wrench or hexagonal socket. As shown in FIG. 10A, second threaded portion 1033 is positioned below tool engaging portion 1034 (relative to ball end 1031) and includes an outside diameter greater than an outside diameter of tool engaging portion 1034.

In some embodiments, conductive core 1030, ball end 1031, second threaded portion 1033, and tool engaging portion 1034 may be formed as one element of conductive material, such as copper, brass, steel, or aluminum. In other implementations, one or more of these components may be formed separately and secured to conductive core 1030, such as via welding, etc.

During assembly, as shown in FIG. 10B, first threaded portion 1032 of conductive body of grounding interface 1002 may be inserted into multi-function bore 1022 to engage threaded portion 1028 in multi-function bore 1022. A socket or wrench may be used to apply torque to tool engaging portion 1034 to secure grounding interface 1002 to grounding device 1000.

When it is no longer necessary to ground connector 100, insulating cap 1003 is installed over grounding interface 1002 and second tapered portion 1012 and secured via second threaded portion 1033 in grounding interface 1002.

In one embodiment, insulated cap 1003 includes an outer conductive or semi-conductive shield 1036, an insulative inner housing 1038, typically molded from an insulative rubber or epoxy material, a conductive or semi-conductive insert 1040, and an engagement portion 1042. Conductive or semi-conductive insert 1040 is configured to surround ball end 1031 of grounding interface 1002 when insulated cap 1003 is installed on grounding device 1000.

As shown in FIGS. 10B and 10C, insulated cap 1003 includes a substantially conical cavity 1044 formed therein for receiving ball end 1031 and second tapered portion 1012 of grounding device 1000. The conical configuration of cavity 1044 generally corresponds to the tapered configuration of second tapered portion 1012 to allow insulated cap 1003 to become seated on grounding device 1000 during installation.

As shown in FIGS. 10B and 10C, engagement portion 1042 may include internal threads 1046 for engaging the second threaded portion 1033 of grounding interface 1002. In one implementation, engagement portion 1042 may be formed of a rigid material (e.g., plastic or metal) and may be press-fit into a recess formed into insert 1040. In other embodiments, engagement portion 1042 may be secured to insert 1040 for other means, such as an adhesive, etc. During assembly, as shown in FIG. 10C, the threads 1046 of engagement portion 1042 of insulated cap 1003 may be threaded into second threaded portion 1033 and tightened (e.g., by hand) to secure insulated cap 1003 to grounding device 1000.

Although not shown in FIGS. 10A-10C, in some embodiments insulated cap 1003 may include a voltage detection test point assembly, a test point cap, and/or a bailing assembly similar to those described above with respect to FIGS. 1A-2.

It should be noted that, although FIGS. 10A-10C depict grounding device 1000 and grounding interface 1002 as two separate elements, in other implementations consistent with embodiments described herein, these elements may be combined, such that grounding interface 1002 is formed integral with conductive core 1004. In such an implementation, grounding device 1000 may be installed into power cable elbow connector using a socket on tool engaging portion 1034.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments. For example, although grounding interfaces 658, 902, and 1002 have been illustrated and described in terms of ball ends 665, 931, and 1031, and grounding device 113 of elbow connector 100 has been illustrated and described in terms of a cylindrical, clamp engaging end 140, in other embodiments difference configurations may be implemented in a manner consistent with the described features. For example, grounding device 113 may be provided with a ball end interface and grounding cam-op link assembly 650 may be provided with a cylindrical clamp engaging end. In still other embodiments, different configurations of clamp engaging surfaces may be implemented.

Implementations may also be used for other devices, such as other high voltage switchgear equipment, such as any 15 kV, 25 kV, or 35 kV equipment. For example, various features have been mainly described above with respect to elbow power connectors. In other implementations, other medium/high voltage power components may be configured to include the grounding assemblies described herein.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above-mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. An electrical connector assembly, comprising:
a connector body comprising:
a conductor receiving end;

a first connector end formed substantially perpendicularly to an axial direction of the conductor receiving end,
    wherein the first connector end includes a first axial bore configured to receive a bushing element therein;
a second connector end formed substantially perpendicularly to the axial direction of the conductor receiving end and opposing the first connector end,
    wherein the second connector end includes a second axial bore formed therein; and
a grounding element having an insulated body and a conductive core portion extending therethrough,
    wherein the grounding element is configured for insertion into the second axial bore of the second connector end,
    wherein the conductive core portion includes an exposed portion projecting above a surface of the insulated body,
    wherein the exposed portion of the grounding element is configured for attachment by a grounded hot line clamp to ground the electrical connector assembly, and
    wherein the exposed portion of the conductive core comprises a generally cylindrical configuration for engaging clamping members of the hot line clamp.

2. The electrical connector assembly of claim 1, wherein the second axial bore in the second connector end includes a tapered configuration, and
    wherein a first end of the insulated body of the grounding element includes a correspondingly tapered configuration for engaging the tapered configuration of the second axial bore.

3. The electrical connector assembly of claim 2, wherein the exposed portion of the conductive core projects from a surface of a second end of the insulated body,
    wherein the second end of the insulated body includes a tapered configuration.

4. The electrical connector assembly of claim 1, wherein the exposed portion comprises a multi-function bore formed axially therein,
    wherein the multi-function bore includes a first grounding element attachment portion and a second securing portion separate from the grounding element attachment portion, and
    wherein, following insertion of the grounding element into the second bore of the second connector end, the grounding element is secured within the second bore by application of a tool within the first grounding element attachment portion of the multi-function bore.

5. The electrical connector assembly of claim 4, further comprising:
    an insulated cap configured to cover the exposed portion of the grounding element when the electrical connector is in a non-grounded configuration.

6. The electrical connector assembly of claim 5, wherein the insulated cap comprises an insulated body and a securing element,
    wherein the insulated body of the insulated cap comprises a tapered cavity therein for receiving the second end of the insulated body of the grounding element,
    wherein the securing element of the insulated cap projects within the tapered cavity,
    wherein the multi-function bore includes a second cap-securing portion, and
    wherein, upon placement of the tapered cavity of the insulated cap on the tapered second end of the insulated body of the grounding element, the securing element is configured to engage the cap-securing portion of the multi-function bore.

7. The electrical connector assembly of claim 6, wherein the securing element comprises a threaded stud and wherein the cap-securing portion of the multi-function bore comprises a correspondingly threaded portion of the multi-function bore.

8. The electrical connector assembly of claim 1, wherein the exposed portion of the conductive core comprises a ball configuration for engaging a ball socket in the hot line clamp.

9. The electrical connector assembly of claim 1, wherein the first end of the insulated body of the grounding element includes a threaded aperture formed axially therein for engaging a threaded stud projecting from the bushing element received in the first axial bore of the first connector end.

10. The electrical connector assembly of claim 1, wherein the connector body further comprises:
    a link interface opening formed substantially perpendicularly to the axial direction of the conductor receiving end substantially parallel to the second connector end,
    wherein the link interface opening includes a third axial bore formed therein.

11. The electrical connector assembly of claim 10, wherein the grounding element comprises:
    a grounding cam-op link assembly, comprising:
        a link body portion;
        a rearward link interface that projects from the link body to engage the third axial bore in the link interface opening,
            wherein the rearward link interface comprises a bus for conductively coupling to a power cable in the connector body;
        a forward link interface that projects from the link body to engage the second axial bore in the second connector end,
            wherein the forward link interface comprises a conductive core for conductively coupling to the bushing element in the first axial bore of the first connector end; and
        a grounding interface that projects from the link body portion,
            wherein the grounding interface is conductively coupled to the conductive core of the forward link interface.

12. The electrical connector assembly of claim 11,
    wherein the grounding cam-op link comprises an insulative material formed between the rearward link interface and the forward link interface to electrically isolate the bus in the rearward link interface from the conductive core of the forward link interface.

13. The electrical connector assembly of claim 11, wherein the grounding interface of the grounding cam-op link assembly comprises a generally cylindrical configuration for engaging clamping members of the hot line clamp.

14. The electrical connector assembly of claim 11, wherein the grounding interface of the grounding cam-op link assembly comprises a ball configuration for engaging a ball socket in the hot line clamp.

15. A medium or high voltage power cable elbow connector assembly, comprising:
    a connector body having a conductor receiving end, a bushing receiving end projecting substantially perpendicularly from the connector body, and a connection end projecting substantially perpendicularly from the connector body and oriented substantially opposite to the bushing receiving end,
    wherein the connector body includes a first axial bore that communicates with each of a second axial bore and a third axial bore in the bushing receiving and connection ends, respectively, and wherein the bushing receiving end is configured to receive a switchgear bushing therein;

a grounding device configured for insertion into the third axial bore of the connection end, wherein the grounding device is configured to conductively connect to the switchgear bushing, wherein the grounding devices include an exposed conductive portion configured to engage a grounded hot line clamp, during grounding of the electrical connector assembly, wherein the exposed conductive portion of the grounding device comprises one of a cylindrical configuration for engaging clamping members of the hot line clamp or a ball configuration for engaging a ball socket of the hot line clamp; and an insulated cap configured to cover the exposed conductive portion of the grounding device during normal operation of the electrical connector.

16. A method, comprising:

connecting a bushing interface of the power cable elbow connector to a switchgear bushing, wherein the power cable elbow connector further comprises a connector body for receiving a power cable therein, and a connector end projecting from the connector body oppositely from the bushing interface, wherein the connector end includes an axial bore therein;

inserting a grounding device into the axial bore in the connector end, wherein the grounding device includes an insulated body and a conductive core extending therethrough, wherein the conductive core is configured to couple with the bushing in the bushing interface and further includes an exposed conductive portion projecting from the insulated body, wherein the exposed conductive portion includes a generally cylindrical configuration for engaging clamping members of a hot line clamp during;

installing an insulated cap over the exposed conductive portion of the grounding device;

energizing the power cable elbow connector;

de-energizing the power cable elbow connector;

removing the insulated cap; and attaching the hot line clamp to the exposed conductive portion of the grounding device, wherein the hot line clamp is coupled to a ground line to ground the power cable elbow connector.

17. The method of claim 16, wherein the insulated cap further comprises a voltage test point, the method further comprising:

testing a voltage of the power cable electrical connector via the voltage test point in the insulated cap to determine whether the power cable elbow connector has been de-energized; and removing the insulated cap when it is determined that the power cable elbow connector has been de-energized.

* * * * *